US009502433B2

(12) United States Patent
Nygaard

(10) Patent No.: US 9,502,433 B2
(45) Date of Patent: *Nov. 22, 2016

(54) SCHOTTKY CLAMPED RADIO FREQUENCY SWITCH

(71) Applicant: QUALCOMM Incorporated, San Diego, CA (US)

(72) Inventor: Paul A. Nygaard, Carlsbad, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 14/929,206

(22) Filed: Oct. 30, 2015

(65) Prior Publication Data
US 2016/0086975 A1    Mar. 24, 2016

Related U.S. Application Data

(63) Continuation of application No. 14/491,783, filed on Sep. 19, 2014, now Pat. No. 9,177,968.

(51) Int. Cl.
| | |
|---|---|
| H01L 29/78 | (2006.01) |
| H01L 27/12 | (2006.01) |
| H01L 29/786 | (2006.01) |
| H01L 21/84 | (2006.01) |
| H01L 27/06 | (2006.01) |
| H01L 27/07 | (2006.01) |

(52) U.S. Cl.
CPC .......... *H01L 27/1203* (2013.01); *H01L 21/84* (2013.01); *H01L 27/0629* (2013.01); *H01L 27/0727* (2013.01); *H01L 29/7839* (2013.01); *H01L 29/78615* (2013.01)

(58) Field of Classification Search
CPC ............... H01L 29/78606; H01L 29/78612; H01L 29/78615
See application file for complete search history.

(56) References Cited

U.S. PATENT DOCUMENTS

| | | | |
|---|---|---|---|
| 4,801,983 A | 1/1989 | Ueno et al. | |
| 4,823,172 A | 4/1989 | Mihara | |
| 4,871,686 A | 10/1989 | Davies | |
| 4,965,213 A | 10/1990 | Blake | |

(Continued)

OTHER PUBLICATIONS

Huang and O, Schottky-Clamped NMOS Transistors Implemented in a Conventional 0.8-um CMOS Process, IEEE Electron Device Letters, Sep. 1998, vol. 19, No. 9, p. 326-28.

(Continued)

*Primary Examiner* — Mohsen Ahmadi
*Assistant Examiner* — Stephen Bradley
(74) *Attorney, Agent, or Firm* — Haynes and Boone, LLP

(57) ABSTRACT

Various methods and devices that involve radio frequency (RF) switches with clamped bodies are provided. An exemplary RF switch with a clamped body comprises a channel that separates a source and a drain. The RF switch also comprises a clamp region that spans the channel, extends into the source and drain, and has a lower dopant concentration than both the source and drain. The RF switch also comprises a pair of matching silicide regions formed on either side of the channel and in contact with the clamp region. The clamp region forms a pair of Schottky diode barriers with the pair of matching silicide regions. The RF switch can operate in a plurality of operating modes. The pair of Schottky diode barriers provide a constant sink for accumulated charge in the clamped body that is independent of the operating mode in which the RF switch is operating.

23 Claims, 8 Drawing Sheets

(56) References Cited

U.S. PATENT DOCUMENTS

| | | | |
|---|---|---|---|
| 5,317,181 A | 5/1994 | Tyson | |
| 5,729,039 A | 3/1998 | Beyer et al. | |
| 5,804,858 A | 9/1998 | Hsu et al. | |
| 5,811,855 A | 9/1998 | Tyson et al. | |
| 5,821,575 A * | 10/1998 | Mistry | H01L 21/84 257/281 |
| 5,930,605 A | 7/1999 | Mistry et al. | |
| 5,965,917 A | 10/1999 | Maszara et al. | |
| 5,986,306 A * | 11/1999 | Nakajima | H01L 21/266 257/352 |
| 6,017,801 A | 1/2000 | Youn | |
| 6,373,082 B1 | 4/2002 | Ohno et al. | |
| 6,525,381 B1 | 2/2003 | Long et al. | |
| 6,633,067 B2 | 10/2003 | Noble | |
| 6,677,645 B2 | 1/2004 | Bryant et al. | |
| 6,787,422 B2 | 9/2004 | Ang et al. | |
| 6,940,130 B2 | 9/2005 | Bryant et al. | |
| 7,009,263 B2 | 3/2006 | Enders et al. | |
| 7,211,865 B2 | 5/2007 | Takizawa | |
| 7,402,865 B2 | 7/2008 | Ipposhi et al. | |
| 7,442,619 B2 | 10/2008 | Luo et al. | |
| 7,446,001 B2 | 11/2008 | Mathew et al. | |
| 7,453,122 B2 * | 11/2008 | Huang | H01L 29/42384 257/347 |
| 7,611,931 B2 | 11/2009 | Cheng et al. | |
| 7,687,365 B2 | 3/2010 | Sleight | |
| 8,067,804 B2 | 11/2011 | Maegawa et al. | |
| 8,450,798 B2 | 5/2013 | Session | |
| 8,692,324 B2 | 4/2014 | Korec et al. | |
| 8,723,260 B1 | 5/2014 | Carroll et al. | |
| 8,742,502 B2 | 6/2014 | Brindle et al. | |
| 9,177,968 B1 * | 11/2015 | Nygaard | H01L 27/1203 |
| 9,178,061 B2 * | 11/2015 | Cai | H01L 29/0847 |
| 2005/0020015 A1 | 1/2005 | Mathew et al. | |
| 2008/0191285 A1 | 8/2008 | Ko et al. | |
| 2010/0032759 A1 | 2/2010 | Chang et al. | |
| 2011/0163379 A1 | 7/2011 | Sleight et al. | |
| 2012/0115287 A1 | 5/2012 | Chen et al. | |
| 2012/0313174 A1 | 12/2012 | Chang et al. | |

OTHER PUBLICATIONS

Larson and Snyder, Overview and Status of Metal S/D Schottky-Barrier MOSFET Technology, IEEE Transactions on Electron Devices, May 2006, vol. 53, No. 5, p. 1048-58.

Notice of Allowance dated Jul. 1, 2015 for U.S. Appl. No. 14/491,783.

Office Action dated Apr. 9, 2015 for U.S. Appl. No. 14/491,783.

Sleight and Mistry, DC and Transient Characterization of a Compact Schottky body Contact Technology for SOI Transistors, IEEE Transactions on Electron Devices, Jul. 1999, vol. 46, No. 7.

Huang F.J., et al., "Schottky-Clamped NMOS Transistors Implemented in a Conventional 0.8-um CMOS Process," IEEE Electron Device Letters, Sep. 1998, vol. 19, No. 9, pp. 326-328.

International Search Report and Written Opinion—PCT/US2015/050096—ISA/EPO—Jan. 13, 2016.

Larson J.M., "Overview and Status of Metal S/D Schottky-Barrier MOSFET Technology," IEEE Transactions on Electron Devices, May 2006, vol. 53 (5), pp. 1048-1058.

Sleight J.W., et al., "DC and Transient Characterization of a Compact Schottky Body Contact Technology for SOI Transistors", IEEE Transactions on Electronic Devices, IEEE Service Center, Pisacataway, NJ, US, vol. 46, No. 7, Jul. 1, 1999.

* cited by examiner

100

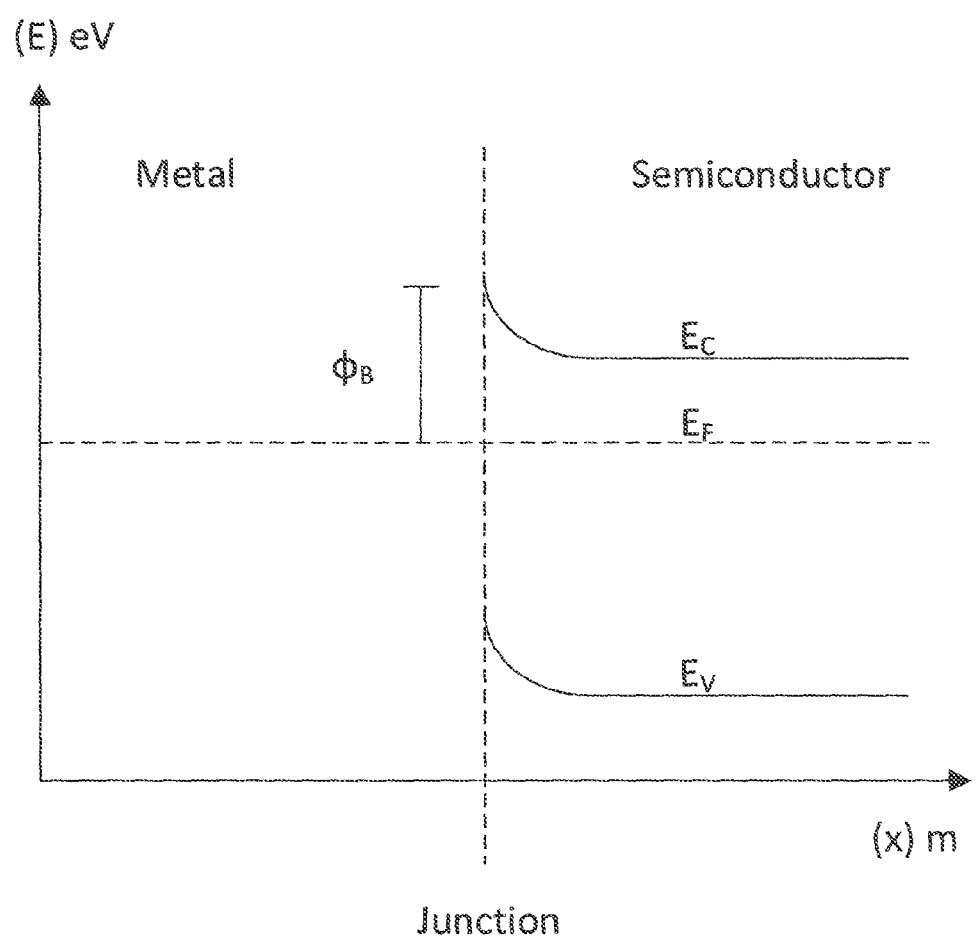

500

SCHOTTKY CLAMPED RADIO FREQUENCY SWITCH

CROSS REFERENCE TO RELATED APPLICATIONS

This application claim the benefit of U.S. patent application Ser. No. 14/491,783, filed on Sep. 19, 2014, which is incorporated by reference in its entirety herein for all purposes.

BACKGROUND OF THE INVENTION

Radio frequency (RF) switches are placed in extreme conditions relative to switches operating in other technical regimes. In certain applications, these switches need to operate in the hundreds of gigahertz (GHz) range and handle upwards of one watt of input power in a linear fashion. In addition, RF switches need to exhibit a low on-state resistance to minimize power consumption and to avoid degrading the signals on which they operate. To achieve this level of performance, RF switches often exhibit extremely large widths relative to devices in alternative regimes. For comparison, current digital logic transistors have widths on the order of nanometers (nm) while the width of an RF switch transistor can be on the order of millimeters—differing by a factor of more than a million.

Due to the strenuous conditions in which they are required to operate, RF switches face more extreme versions of common problems faced by standard transistors, and are additionally burdened by a host of problems that do not appear in other technical regimes. For example, the accumulation of charge in the body of a metal-oxide-semiconductor (MOS) RF switch transistor can activate the MOS transistor's parasitic bipolar transistor. In this situation, the accumulated charge in the body of the device serves to bias the body of the MOS transistor as if it were the base of a bipolar transistor. This physical condition results in a performance degradation effect known as the "kink" effect. It is particularly problematic in RF switches implemented on semiconductor-on-insulator (SOI) wafers in which there is no external bias applied to the body of the transistor because there are no low impedance paths for the accumulated charge to follow in order to exit the body.

In addition to experiencing more problematic versions of common problems found in standard transistor technologies, RF switches face additional performance degradation from non-ideal physical conditions that are not problematic in other regimes. Accumulated charge is again also an example of this kind of physical condition. Given the large width of a standard RF switch, accumulated charge can introduce a nonlinear distortion to the signals on which the RF switch is operating while the RF switch is in the off state. While this may be negligible for transistors with small widths, the parasitic capacitance caused by accumulated charge aligned at the body junctions along the entire width of an RF switch has a significant negative effect on signals coupled to the terminals of the RF switch when it is in its off state.

RF switch transistors present a particular design challenge as compared to more standard transistors. Physical effects that cause performance degradation in standard transistors are felt more acutely in the RF regime. In addition, certain physical effects manifest themselves in performance degradation modes that are inconsequential outside of the RF regime. Therefore, device engineers working on RF switches employ specialized design methodologies and device configurations to deal with physical effects that are not generally a concern in other operating regimes.

SUMMARY OF INVENTION

In one embodiment, a radio frequency (RF) switch comprises a channel that separates a source and a drain. The RF switch also comprises a clamp region that spans the channel, extends into the source and drain, and has a lower dopant concentration than both the source and drain. The RF switch also comprises a pair of matching silicide regions formed on either side of the channel and in contact with the clamp region. The clamp region forms a pair of Schottky diode barriers with the pair of matching silicide regions. The RF switch can operate in a plurality of operating modes. The pair of Schottky diode barriers provide a constant sink for accumulated charge in the clamped body that is independent of the operating mode in which the RF switch is operating.

In one embodiment, an RF switch comprises a channel separating a source and a drain of the RF switch. The RF switch also comprises a first clamp region of a semiconductor material that: (i) spans the channel; (ii) comprises a first contact region extending into the source; and (iii) comprises a second contact region extending into the drain. The RF switch also comprises a first silicide region formed on the first contact region. The RF switch also comprises a second silicide region formed on the second contact region. The first clamp region of the semiconductor material has a lower dopant concentration than both the source and the drain. The first contact region forms a first Schottky diode barrier with the first silicide region. The second contact region forms a second Schottky diode barrier with the second silicide region.

In one embodiment, an RF switch comprises a gate that comprises a gate electrode and a gate insulator. The RF switch also comprises a channel that: (i) is located in a body of the radio frequency switch; and (ii) is insulated from the gate electrode by the gate insulator. The RF switch also comprises a first doped region located across the channel from a second doped region. The RF switch also comprises a third region that: (i) spans the channel; (ii) extends into the first and second doped regions; and (iii) has a lower dopant concentration than the first and second doped regions. The RF switch also comprises a first silicide region that forms a first Schottky diode junction with the third region. The RF switch also comprises a second silicide region that: (i) is located across the channel from the first silicide region; and (ii) forms a second Schottky diode with the third.

BRIEF DESCRIPTION OF THE DRAWINGS

FIG. 3 illustrates an energy band diagram of a Schottky barrier that is in accordance with embodiments of the present invention.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers all such modifications and variations within the scope of the appended claims and their equivalents.

Figure 1:
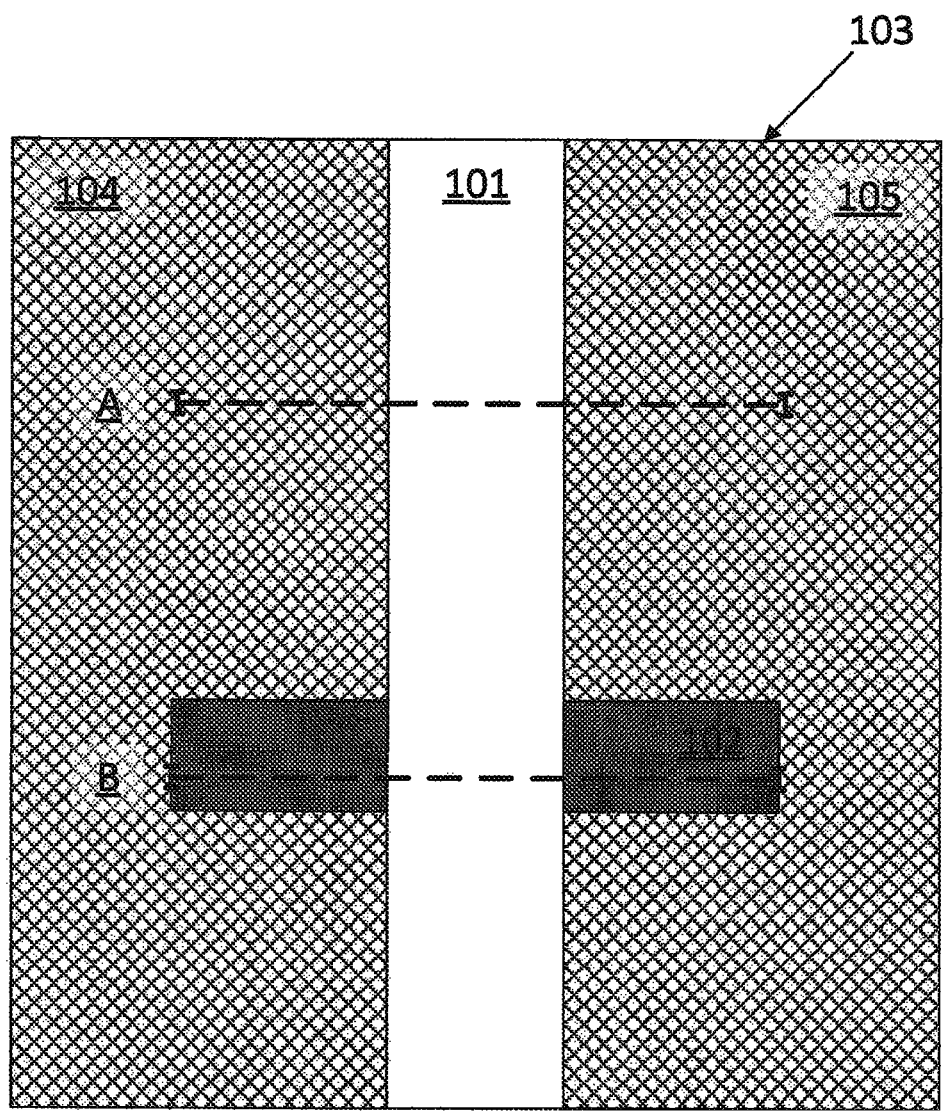
FIG. 1 illustrates a plan view of an RF switch portion having a clamp region that is in accordance with embodiments of the present invention.

FIG. 1 illustrates a plan view of RF switch portion 100. RF switch portion 100 can be a portion of a single finger of a multiple finger transistor. Multiple finger transistors are transistors that create a conductive path between two circuit nodes under the control of separate physical gate electrodes that are commonly coupled to a single gate signal. The source and drain regions of the multiple fingers can be wholly separate. However, in certain approaches the drain or source of two fingers will be a shared physical region that lies between the gate electrodes of the two fingers. RF switch portion 100 comprises gate 101 which is drawn semi-transparent to illustrate portions of a clamp region 102 and active region 103 below gate 101. The operation of clamp region 102 and active region 103 will be described in more detail below. FIG. 1 also includes two reference lines A and B that illustrate the relationship between the plan view of FIG. 1 and the cross sections of FIGS. 2A and 2B.

A channel separates source 104 from drain 105. The channel is formed in active region 103 and lies below gate 101. A channel is a region of a transistor that is formed in the body of the transistor and provides a conductive path from the source to the drain in response to a control signal on the gate. The active region 103 of RF switch portion 100 can be implanted with a heavy implant of ions to the source and drain regions using gate 101 as a mask. As a result, the portion of active region 103 that lies below gate 101 will serve as a body of the RF switch and the portions that are not below gate 101 will serve as the source and drain. An example of how the implant forms the source and drain as distinct regions from the body is illustrated by cross section 200 in FIG. 2A. In certain approaches, the body will also extend below the source and drain regions. For example, if the RF switch is implemented on a bulk substrate, the body will comprise the region of the substrate below the source and drain that was not altered by the heavy implant.

Cross section 200 shows one implementation of RF switch portion 100 along reference line A. Cross section 200 shows RF switch portion 100 implemented in a thin active region 203 which is in accordance with one implementation of active region 103. As drawn, the source and drain regions 104 and 105 are implemented as source and drain regions 201 and 202 that extend all the way down to buried insulator 204. Buried insulator 204 can be the insulator of a semiconductor-on-insulator (SOI) wafer. For example, the insulator could be an oxide. Active region 203 can be an ultra-thin silicon layer. The body of RF switch portion 100 comprises region 206. The channel of RF switch portion 100 is illustrated in cross section 200 as region 207. Gate 101 includes a gate electrode and a gate oxide 212 that separates the gate electrode from the channel. The width of the channel is measured along a normal vector to reference line A that lies in the plane of FIG. 1. The length of the channel is measure along reference line A. As such, reference line A can be referred to as a lengthwise dimension vector of the channel.

The body of the transistor can be have a dopant concentration in dopant species per meter cubed ($n/m^3$) equal to the dopant concentration of the active region of the original wafer used to form the RF switch. In certain approaches, this concentration will be in the range of $10^{14}$-$10^{17}$ $n/m^3$. If the RF switch is implemented in an SOI process, the original dopant concentration may be the residual dopant concentration of the donor wafer used to produce the SOI wafer. In these approaches, the dopant concentration may be on the order of $10^{15}$ $n/m^3$. The body can also be a well formed in the surface of the wafer that has a different dopant concentration that the original wafer such as when the RF switch is implemented in a process that provides both n-type and p-type transistors in a single substrate. The body can also comprise a dopant concentration set by a $V_{th}$ implant used to alter the threshold voltages of active devices formed in the substrate.

A clamp region 102 spans the channel of RF switch portion 100 and extends into source 104 and drain 105. The clamp region has a lower dopant concentration than the source and the drain. In specific approaches, the clamp region has the original concentration of the active layer in which the switch is formed. In some processing approaches, a clamp region 102 with such characteristics can be formed by creating a hole in the heavy implant used to form the source and drain using a mask to block the heavy implant. An example of clamp region 102 is illustrated by cross section 210 in FIG. 2B.

Cross section 210 shows one implementation of RF switch portion 100 along reference line B. Cross section 210 shows RF switch portion 100 implemented in a thin active region 203 that is in accordance with one implementation of active region 103. Active region 203, buried insulator 204, source region 201, and drain region 202 are the same regions as described in FIG. 2A. In the illustrated example, clamp region 102 extends all the way down to buried insulator 204, spans the channel, and extends into source region 201 and drain region 202. The width of clamp region 102 is measured along a normal vector to reference line B that lies in the plane of FIG. 1. The length of the clamp region is measured along reference line B. As such, reference line B can be referred to as a lengthwise dimension vector of the clamp region.

Figure 2A:
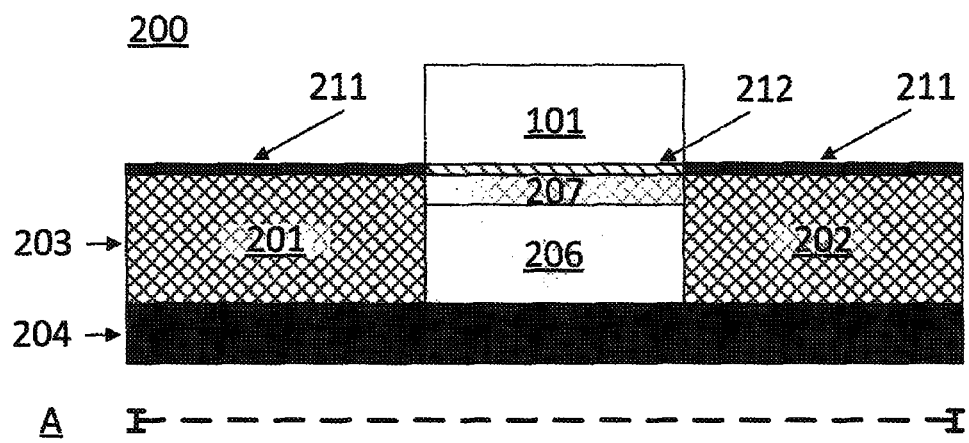
FIG. 2A illustrates a cross section of one implementation of the plan view in FIG. 1 along reference line A.
Figure 2B:
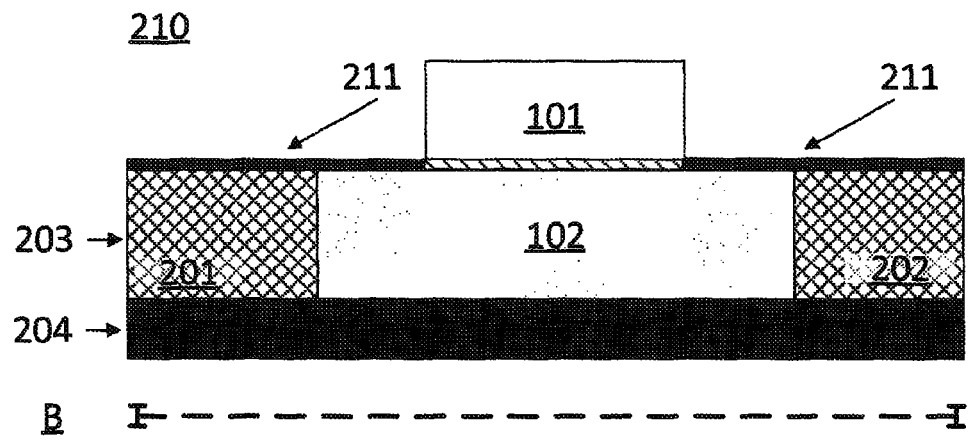
FIG. 2B illustrates a cross section of one implementation of the plan view in FIG. 1 along reference line B.

Cross section 210 also illustrates a pair of matching silicide regions 211 formed on either side of channel 207. Silicides are commonly used to reduce resistance in integrated circuit processes. As drawn, the silicide regions 211 cover portions of clamp region 102 as well as source 201 and drain 202. Silicides also form Schottky diode barriers when constructed on a semiconductor material, such as silicon, when the semiconductor material is lightly doped. In this situation, the silicide regions 211 could have been formed in a single step, and could also cover the surfaces of source 201 and drain 202 in cross section 200 as shown in FIG. 2A.

Clamp region 102 forms a pair of Schottky diode barriers with the pair of matching silicide regions 211. The silicide regions could be specifically formed over the clamp region and be independently biased from the source and drain contacts. However, as in the illustrated approach, the silicide regions 211 can be connected to the same contacts as are used to route signals to source 201 and drain 202. This approach provides a significant benefit in that the silicide step used to treat the drain and source is also used to create contacts to the drain and source, and would be conducted regardless of the presence of the clamp region. Therefore, a special processing step is not required to form the Schottky diode junctions. Instead, in these approaches the only modification to the processing flow that is required to form the clamp region is a modification to the layout introduced when the source and drain areas are initially formed.

The clamp region has a lower dopant concentration than the source and drain. In situations in which the clamp region is formed using a hole in the implant and the source and drain are formed in a self-aligned manner, the clamp region could comprise the same material as the body of the device such that there was no energy barrier between the clamp region and the body. In situations in which the RF switch was implemented in an SOI wafer, this dopant concentration could be the residual concentration of the donor wafer from which the SOI wafer may have been formed. The clamp region could be doped alternatively or cumulatively using a well or threshold voltage implant in situations in which the active region was treated with such an implant.

The Schottky diode junctions effectively short out the P-N junction between the heavily implanted region and the body via the clamp region. As the clamp region has a lower dopant concentration that the source and drain, there is less of an energy barrier between the body and the clamp region than there is between the body and either the source or drain. Due to this low energy barrier, charge carriers in the body that would otherwise accumulate in the body can be collected by the clamp region and syphoned out of the transistor body. The clamp region serves to effectively clamp the body of the device to a set voltage by providing a low impedance channel for the removal of charge carriers that would otherwise build up in the body of the device.

Since the clamp region spans the channel, the relative biasing of the transistor does not affect the performance of the clamp region—regardless of how the transistor is biased the body never floats. The clamp region provides a constant sink for accumulated charge in the clamped body that is independent of the operating mode of the radio frequency switch. In the off state, the clamp will remove charge carriers that could otherwise have produced nonlinear parasitic capacitance by accumulating in the body at the junction between the source and body or drain and body. In the on state, the clamp will remove charge that may have otherwise altered the potential of the body to a point where the parasitic bipolar junction transistor was activated. Therefore, in either operating state, the clamp region will improve the performance of the device. Furthermore, as the relative biasing of the device does not matter for the operation of the clamp region, the resulting RF switch can operate as a symmetrical device such that the terms source and drain can be used interchangeably to describe regions 201 and 202 based upon how the transistor is biased.

The fact that clamp region 102 spans the channel provides additional benefits in terms of the overall process flow. The misalignment of various masks in a semiconductor processing flow can create significant defects in a semiconductor design. As a basic example, conductive shorts could occur between two portions of the circuit that were meant to be isolated. In the case of a clamp region, it is possible for the clamp region to be aligned outside of the channel region such that it was not in contact with the body and would therefore not serve to remove accumulated charge from the body of the transistor. However, as clamp region 102 spans the channel, there is almost no chance that any individual clamp will wholly fail to serve its purpose. Since any contact from the body to the drain or source will produce a beneficial result, the clamp can be misaligned by nearly half of its total length and will still function to remove accumulated charge from the body of the device. Furthermore, in the case of very short gate lengths, the fact that the clamp region can span the channel provides a significant benefit in that the alignment tolerance is set by the length of the clamp region and not the length of the channel. This is beneficial because the marginal performance effect of increasing the length of the clamp is negligible compared to the effect of increasing the length of the transistor channel. Shorter transistor channels produce transistors with lower on state resistance which, as mentioned above, is a key performance metric for RF switches.

FIG. 3 illustrates an energy band diagram 300 of a Schottky diode barrier formed by the junction of a silicide region and a semiconductor region. The y-axis of energy diagram 300 is in units of electrical potential in electron volts and the x-axis is the physical location along the junction in meters with the y-intercept being on the silicide side of the junction. As electrons are free in the conductive metal, the energy diagram on the left side of the junction is illustrated solely by the Fermi level ($E_F$). The metal side of the energy band diagram can be fully defined by $E_F$ and the work function of the metal—which sets the minimum energy needed to release a free carrier in the metal. On the right side of the junction, the energy diagram includes the conduction band edge ($E_C$) and the valance band edge ($E_V$) of the semiconductor material. The difference between the conduction and valance band edges defines the energy band gap of the semiconductor material. The conduction bands bow upwards towards the junction because zero bias is applied to the junction, the semiconductor material is n-type, and the $E_F$ must be equal on either side of the junction.

The selection of metals and bias concentrations for the semiconductor region affect the characteristics of the Schottky barrier. In order for the clamp region to function properly, the clamp should provide a conductive path from the semiconductor region to the metal for excess charge carriers in the body of the transistor, but should not allow charge carriers to "leak" by flowing from the metal into the semiconductor. The zero bias barrier height ($\phi_B$) is the difference between $E_F$ and the conduction band edge at the junction. The bias voltage required to put the junction in a reverse bias state is set by the equation: $\phi_B-(E_C-E_F)$. The second quantity in this equation is set by the doping level in the semiconductor material and the first quantity is set predominately by the work function of the metal. Since the doping level of the clamp region will often be set to a given level by other process considerations (e.g., the nominal active doping level if the clamp is formed through a hole in the implant profile), the barrier height can be controlled through the selection of a metal having a particular work function. Various metals can be used to form the silicide of metal silicide regions 211, such as tungsten, titanium, cobalt, nickel, or, molybdenum. The junction will be less effective at removing excess charge if a large work function metal is select, but it will also be less likely to leak.

Figure 4:
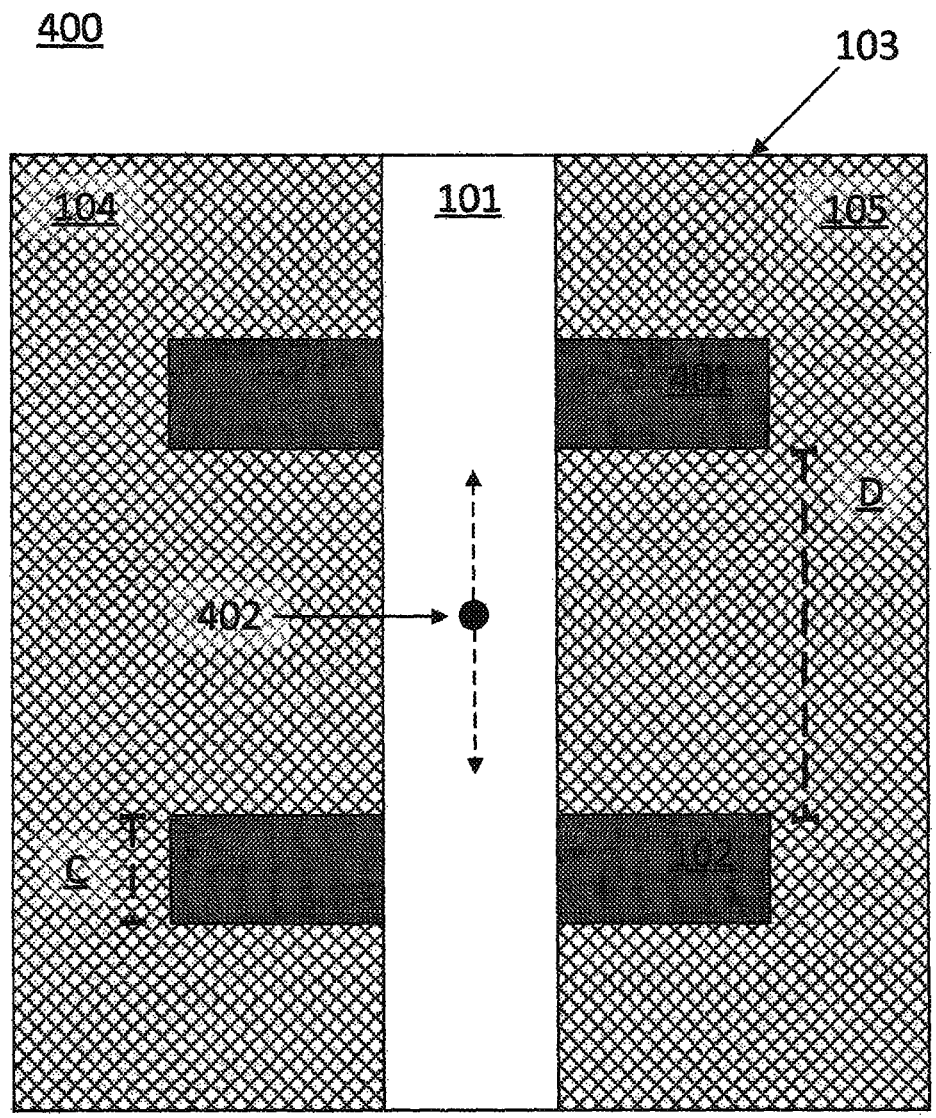
FIG. 4 illustrates a plan view of an RF switch portion having two clamp regions that are in accordance with embodiments of the present invention.

FIG. 4 illustrates a plan view of RF switch portion 400. RF switch portion 400 can take on any of the characteristics described above with reference to RF switch portion 100. However, RF switch portion 400 additionally includes a matching clamp region 401. Matching clamp region 401 can take on any of the characteristics described above with reference to clamp region 102. Matching clamp region 401 is parallel with clamp region 102 and is spaced apart from clamp region 102 along the width of gate 101 by a dimension marked using reference line D. The width of both clamp region 102 and matching clamp region 401 are defined along the width of gate 101 as well. The width of the clamp region is indicated in the plan view of FIG. 4 using reference line C. The selection of these dimensions is critical for the performance of the RF switch to which these devices are a part. The particular manner in which these dimensions affect the performance of the RF switch will be described in more detail below.

An RF switch can comprise a plurality of clamps spread across a plurality of transistor fingers. For example, RF switch portion 400 could be a single finger of a multiple finger transistor that has additional clamp regions in other portions of the illustrated transistor finger as well as on other fingers. The clamps can be evenly spaced along the fingers of the transistor fingers to assure that the entire body of the transistor is adequately clamped. Since different transistor fingers can have different orientations or configurations, spacing between clamps on a single finger are described as having a certain spacing along a "finger width" of the transistor as opposed to along a "width of the transistor." When only a single finger is considered, these terms will be equivalent.

The spacing between adjacent clamping regions and the width of each individual clamping region are critical dimensions for the performance of the overall RF switch. Since the on state resistance of an RF switch transistor is a critical factor, it is particularly important in the RF operating regime to keep the channel unimpeded along its width. However, the clamp regions act to decrease the effective width of the channel because they block the area that would otherwise comprise a forward biased diode between the source and body. This concern militates towards keeping the width of each individual clamp region, as indicated by reference line C in FIG. 4, as small as possible.

Although minimizing the width of each individual clamping region serves to increase the width of an RF switch transistor with all else held equal, the inventors have discovered an unexpected result when trying to minimize the impact of these clamping regions on the performance of the RF switch. When the width of each clamping region was reduced to below 0.2 microns (μm), the clamping regions had no clamping affect. The clamps were implemented in a silicon SOI wafer having an original doping concentration of $10^{15}$ n/m$^3$ and the clamp regions were formed via a hole in the source and drain heavy implant. The inventors then determined that the silicidation step was causing the small clamp region openings to close up due to the enhanced diffusion of the dopants in the silicide. This was an unexpected result that ran counter to the desire to maximize the effective width of the switch. Therefore, in certain approaches, the width of each clamping region can be kept above 0.2 μm, but should be kept close to 0.2 μm to minimize the on-state resistance of the RF switch.

Another way in which the effect of the clamping region on the effective width of the RF switch transistor can be mitigated is to increase the spacing between adjacent clamping regions. As shown in FIG. 4, the dimension marked by reference line D could be increased to cover a transistor having a set width while at the same time decreasing the portion of the channel that is blocked by clamping regions. However, the spacing between clamps cannot be increased without causing countervailing problems. As illustrated in FIG. 4, the farthest an excess charge carrier 402 will have to travel to reach a clamp region is equal to half of the spacing between adjacent clamp regions. The further the carrier has to travel, the less effective the clamp will be for two reasons. First, due to the random movement of charge carriers, it will take longer for the charge carrier to reach the clamp to be removed from the system and charge will tend to build up if it is introduced at a faster rate than it is removed. Second, the further the charge carrier has to migrate through the channel, the larger the IR drop that will be caused by the carriers in aggregate, which will cause the potential of the body to rise. In a silicon SOI wafer with an initial doping concentration of approximately $10^{17}$ n/m$^3$ to $10^{15}$ n/m$^3$, the spacing between adjacent clamps of adequate width should not be increased over 25 μm. In most approaches, a spacing of 20 μm should not be exceeded in order to provide a margin of error and account for the characteristics of different semiconductor materials and processing technologies.

A final consideration that needs to be taken into account when selecting the spacing of adjacent clamp regions and the width of each individual clamp is that the total number of clamps required and the width of each individual clamp affects the degree of leakage in the RF switch. On a silicon SOI wafer with an initial doping concentration of approximately $10^{15}$ n/m$^3$, measurements of roughly 1 nA of leakage were measured at 25° Celsius for a single clamp region with a width of 0.2 μm when the transistor was biased with 0 v potential difference between the gate and source, and 3 v potential difference between the drain and source. Although this is a low value relative to the overall current the transistor passes in the on-state, if clamps are spread throughout the entire length of the transistor, their aggregate leakage can begin to affect the RF switch performance in a non-negligible fashion. In situations such as the one described immediately above, the leakage can be kept to a manageable level by not reducing the spacing between clamps to below 5 μm.

Figure 5:
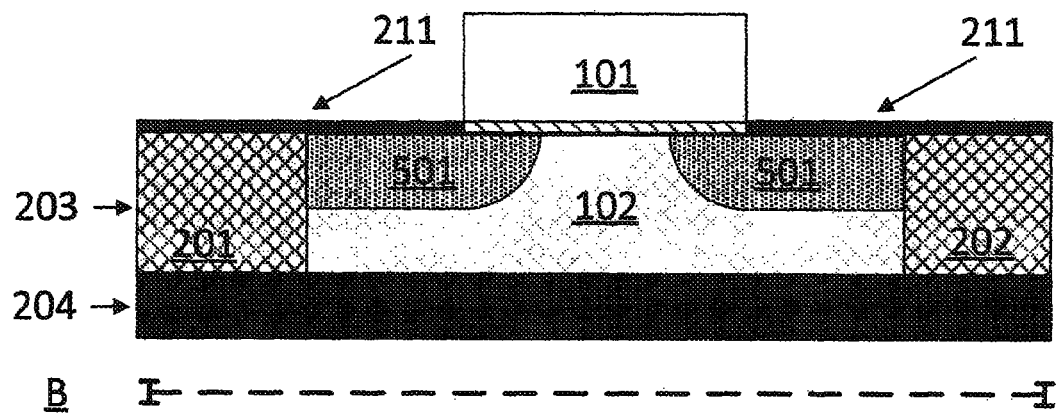
FIG. 5 illustrates a cross section of one implementation of the plan view in FIG. 1 along reference line B.

Cross section 500 in FIG. 5 shows another implementation of RF switch portion 100 along reference line B. Cross section 500 shows RF switch portion 100 from FIG. 1 implemented in a thin active region 203 that is in accordance with one implementation of active region 103. Active region 203, buried insulator 204, source region 201, and drain region 202 are the same regions as described in FIG. 2B. In the illustrated example, clamp region 102 extends all the way down to buried insulator 204, spans the channel and extends into source region 201 and drain region 202. However, as illustrated, the clamp region is not homogeneous from the surface of the substrate down to the buried insulator.

The dopant concentration of clamp region 102 in cross section 500 is still less than the dopant concentration of source 201 and drain 202. However, clamp region 102 now comprises two regions of moderate doping 501. These regions of moderate doping can be formed by a lightly doped drain implant or a halo implant. In the approach illustrated by cross section 500, the clamp region, the source, and the drain are all doped with a lightly doped drain implant but the source and drain are also doped with a heavy implant. The heavy implant has a heavy implant concentration. The lower dopant concentration of the clamp region is less than the dopant concentration of the source and drain by the difference between heavy implant concentration and the moderate doping concentration. The benefit of this approach would be that the step used to conduct the lightly doped drain implant would not need to be modified and only the strong implant would need to be altered. Although the clamp region would exhibit a slightly higher barrier to the removal of excess carriers from the clamped body, in some approaches the cost benefit of not having to modify two different implant steps may be beneficial on balance.

Figure 6:
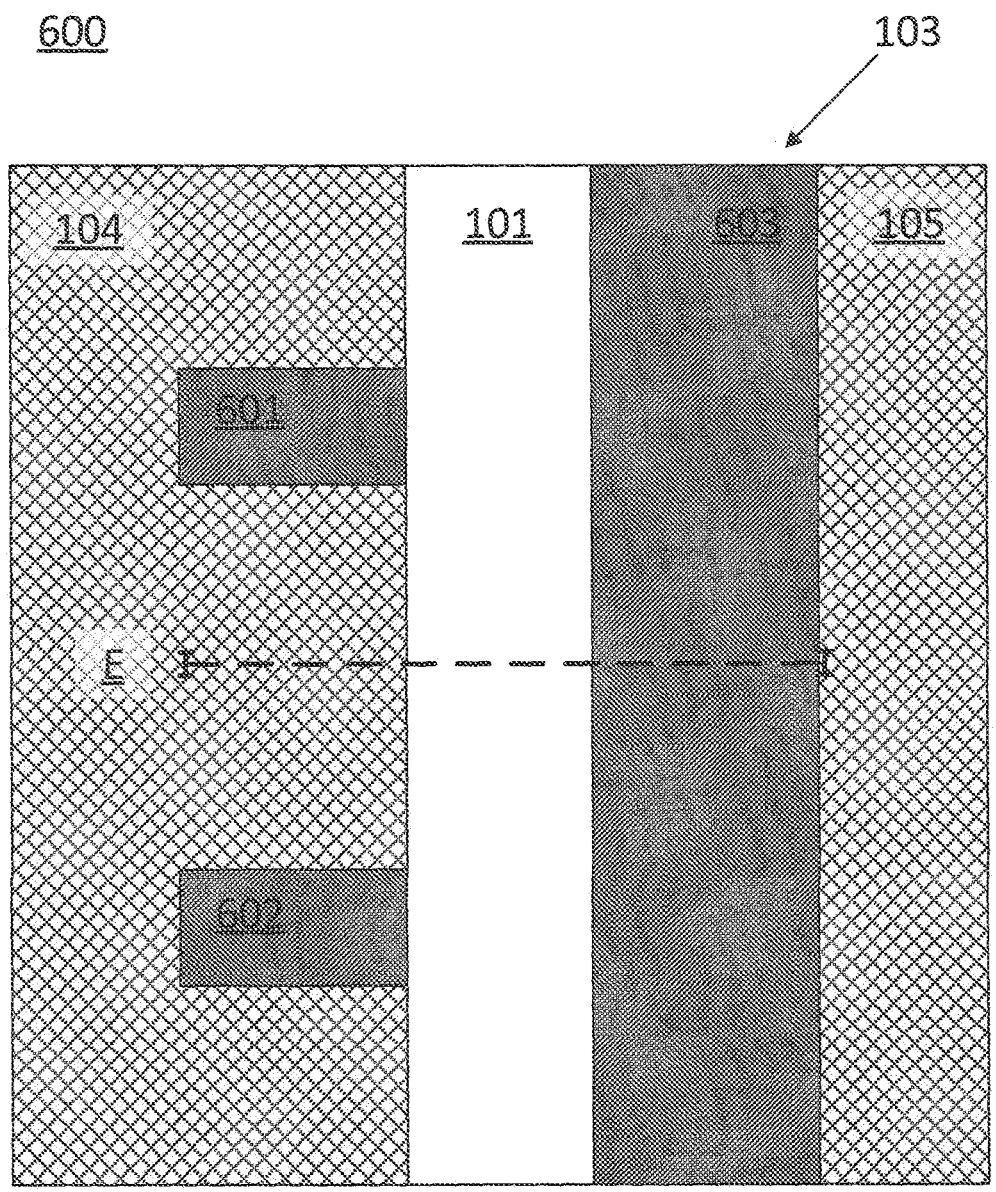
FIG. 6 illustrates a plan view of an RF switch portion having a clamp region that is in accordance with embodiments of the present invention.

FIG. 6 illustrates a plan view of RF switch portion 600. RF switch portion 600 can take on any of the characteristics described above with reference to RF switch portion 100. However, the clamp regions of RF switch portion 600 are asymmetric. Clamp regions 601 and 602 are similar to the source side of clamp regions 401 and 102. However, the drain side of the RF switch comprises a clamp region portion in the entire drain area 603. The resulting RF switch will not be symmetrical in that the portion of the clamp region 603 that borders drain 105 will sink charge much more efficiently and will also leak much more than the portions of the clamp region on the source side of the channel. As a result, the device should not be used as if it were a symmetrical device. P-type versions of RF switch portion 600 should be configured so that region 105 is biased to a lower potential than region 104 and vice versa for n-type versions of RF switch portion 600. Clamp region portion 603 can take on any pattern relative to the portions of the clamp region on the other side of the channel. For example, clamp region portion 603 could include twice as many clamp region portions of similar size to the clamp region portions on the alternative side with a clamp region portion on the drain side interdigitated between each set of adjacent clamps on the source side. In addition any combination of the variant dopant profiles used to form the clamp region can be used in combination with any of the asymmetrical clamp regions described above. For example, the clamp region could comprise the entire drain of an RF transistor and the source could be doped with a halo implant while the drain was not doped with a halo implant.

Figure 7:
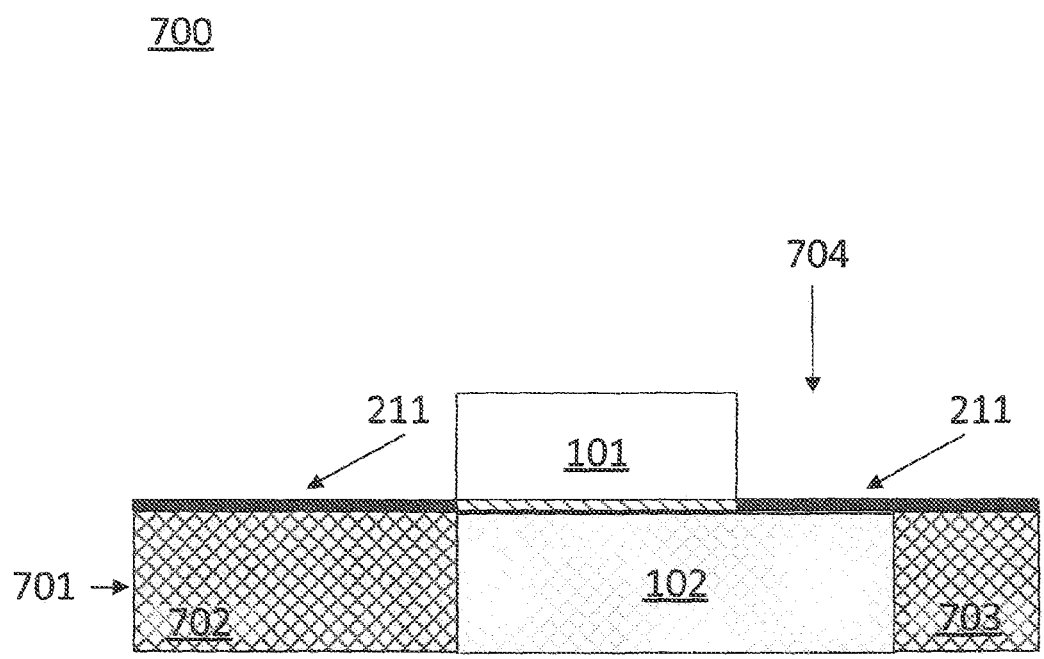
FIG. 7 illustrates a cross section of one implementation of the plan view in FIG. 6 along reference line E.

FIG. 7 illustrates a cross section 700 of one implementation of RF switch portion 600 along reference line E. Cross section 700 includes an active layer 701 that can be implemented on an SOI wafer or a bulk semiconductor wafer. Reference line E is drawn at a point along the width of the channel where the clamp region does not span the channel. Instead, source 702 is similar to that of a transistor that does not have a clamp region while drain 703 includes a Schottky barrier formed between silicide 211 and a portion of clamp region 102 that extends into the drain. As mentioned above, the clamp region 102 has a lower dopant concentration that source 702 and drain 703. Since low doped drain region 704 is present throughout the extent of the width of the channel, it is not shorted at any point, and the resulting transistor exhibits the benefits of a low doped drain transistor. Therefore, the implementation of RF switch portion 600 that is illustrated by cross section 700 has a clamp region to prevent the build-up of unwanted charge in the body of the device, and also includes a low doped drain region 704 that is useful for transistors operating a transistor in a high power regime.

Figure 8:
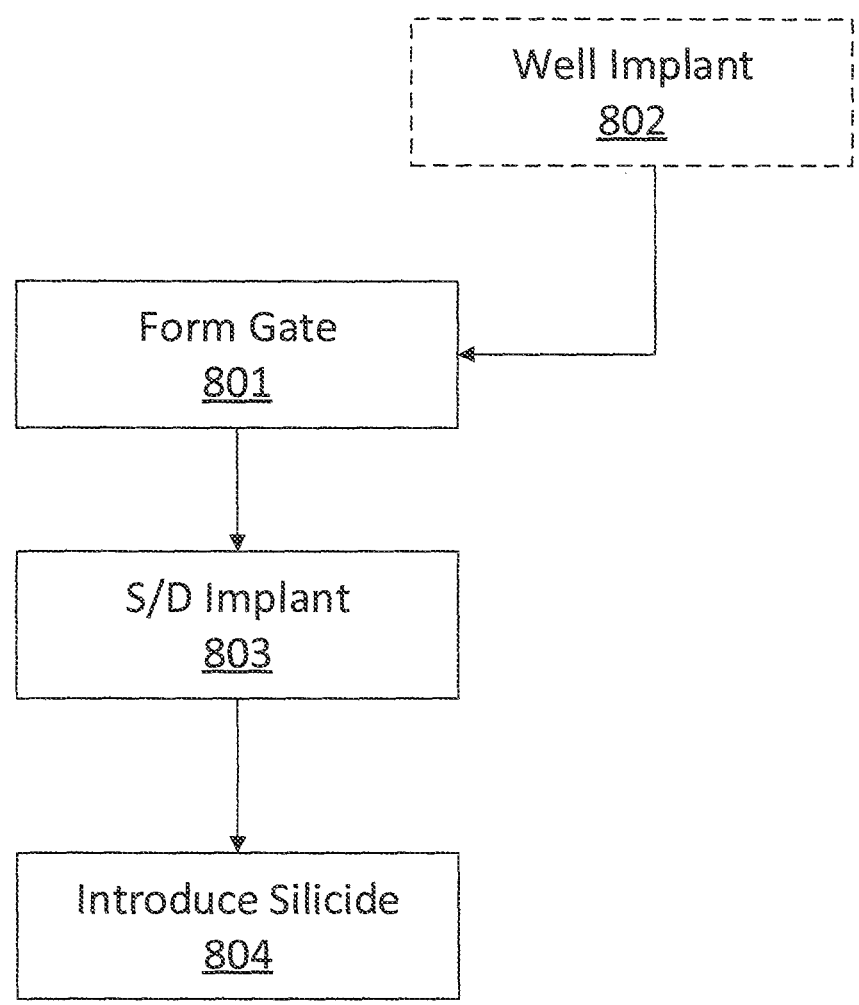
FIG. 8 illustrates a flow chart of a method for fabricating an RF switch portion having a clamp region that is in accordance with embodiments of the present invention.

A method 800 for fabricating an RF switch that is in accordance with the physical devices described above can be explained with reference to FIG. 8. Method 800 begins with step 801 in which a gate is formed over an active region of a semiconductor substrate. The portion of the active region lying immediately underneath the gate can be referred to as the channel of the RF switch. The gate and channel can take on any of the characteristics described above with reference to the previous figures. Additional processing steps that may be conducted along with step 801 include the introduction of a well or $V_{th}$ implant to the active region of the semiconductor substrate. For example, the optional introduction of a well dopant is shown in phantom as step 802.

The method proceeds with step 803 in which a heavy implant is conducted to form the source and drain regions of the RF switch. The source and drain regions can take on any of the characteristics described above with reference to the previous figures. Step 803 can be conducted with the use of a mask to block the implant from certain portions of the source and drain region in order to form a clamp region in the active region of the device. The resulting clamp region will have a lower concentration of dopants that the source and drain region. In certain approaches, the resulting clamp region will have the same concentration as the body of the switch transistor. However, the heavy implant of step 803 could be followed by a lightly doped drain or halo implant for which the mask used to form the clamp region was not used. As a result, the portions of the clamp region that extended into the source and drain would have a different dopant concentration than the body of the switch transistor.

The method proceeds with step 804 in which a self-aligned silicide is formed over the clamp regions. As a result, the clamp regions form Schottky diode junctions with the newly created silicide regions. In specific approaches, the self-aligned silicide will simultaneously form a silicide over the source and drain regions. In this manner, the creation of the Schottky diodes does not require an additional processing step, and the only additional layout modification is implemented using a modified mask during step 703. Given that a mask is sometimes required for this step to block remote portions of the substrate that will not be exposed to the source drain implant, and given the fact that the clamp spans the channel and does not need to be meticulously aligned, the required modifications to the mask are inexpensive to implement. As a result, the process produces an RF switch with a clamped body at little to no additional cost as compared to an RF switch without clamping regions.

Although some embodiments in the above disclosure were specifically illustrated with reference to RF switches implemented using SOI technology with silicon as the semiconductor material, alternative technologies and materials could be used instead. Exemplary alternative processing technologies include, bulk semiconductor processes, semiconductor-on-oxide, and epitaxial semiconductor processes. Exemplary alternative semiconductor materials include, silicon, germanium arsenide, gallium arsenide, gallium nitride, and cadmium telluride. Indeed, any processing technology and semiconductor material that results in RF switches that would otherwise suffer performance effects from the presence of excess charge carriers in the body of the switch could benefit from the teachings herein.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A radio frequency switch with a clamped body comprising:
 a channel that separates a source and a drain;
 a clamp region that spans the channel, extends into the source and drain, and has a lower dopant concentration than both the source and drain; and a pair of matching silicide regions formed on either side of the channel and in contact with the clamp region;
a matching clamp region that spans the channel;
wherein the matching clamp region and the clamp region are spaced apart by less than 20 microns;
wherein the matching clamp region and the clamp region are at least 0.2 microns wide along the overall width of the channel and wherein the clamp region forms a pair of Schottky diode barriers with the pair of matching silicide regions.

2. The radio frequency switch of claim 1, wherein:
a lengthwise dimension vector of the matching clamp region is parallel with a lengthwise dimension vector of the clamp region.

3. The radio frequency switch of claim 2, comprising:
a plurality of transistor fingers; and
a plurality of additional clamp regions;
wherein the plurality of transistor fingers comprise a plurality of finger widths that each contribute to an overall width of the channel; and
wherein each additional clamp region in the plurality of additional clamp regions is spaced apart from at least one other additional clamp region in the plurality of clamp regions by less than 20 microns along a finger width in the plurality of finger widths.

4. The radio frequency switch of claim 3, wherein:
each of the plurality of additional clamp regions are at least 0.2 microns wide along the overall width of the channel.

5. The radio frequency switch of claim 1, wherein:
the clamp region comprises silicon; and
the source, drain, and clamped body are all in contact with a buried insulator layer of a silicon on insulator wafer.

6. The radio frequency switch of claim 1, wherein:
the clamp region, the source, and the drain are all doped with a lightly doped drain implant that has a moderate implant concentration;
the source and drain are also doped with a heavy implant that has a heavy implant concentration; and
the lower dopant concentration is less than a dopant concentration of the source and drain by at least the difference between the moderate implant concentration and the heavy implant concentration.

7. A radio frequency switch with a clamped body comprising:
a channel separating a source and a drain of the radio frequency switch;
a first clamp region of a semiconductor material that:
 (i) spans the channel;
 (ii) comprises a first contact region extending into the source; and
 (iii) comprises a second contact region extending into the drain;
a matching clamp region of the semiconductor material that spans the channel;
a first silicide region formed on the first contact region; and
a second silicide region formed on the second contact region;
wherein the first clamp region of the semiconductor material has a lower dopant concentration than both the source and the drain;
wherein the first clamp region of the semiconductor material and the matching clamp region of the semiconductor material are spaced apart by less than 20 microns along a width of the channel;
wherein the clamp region and the matching clamp region are at least 0.2 microns wide along the width of the channel;
wherein the first contact region forms a first Schottky diode barrier with the first silicide region; and
wherein the second contact region forms a second Schottky diode barrier with the second silicide region.

8. The radio frequency switch of claim 7, wherein:
a lengthwise dimension vector of the matching clamp region of the semiconductor material is parallel with a lengthwise dimension vector of the first clamp region of the semiconductor material.

9. The radio frequency switch of claim 8, comprising:
a plurality of transistor fingers; and
a plurality of additional clamp regions; wherein the plurality of transistor fingers comprise a plurality of finger widths that each contribute to the width of the channel; and
wherein each additional clamp region in the plurality of clamp regions is spaced apart from at least one other additional clamp region in the plurality of clamp regions by less than 20 microns along a finger width in the plurality of finger widths.

10. The radio frequency switch of claim 9, wherein:
each of the plurality of additional clamp regions are at least 0.2 microns wide along the width of the channel.

11. The radio frequency switch of claim 7, wherein:
the first clamp region comprises silicon; and
the source, the drain, and the clamped body are all in contact with a buried insulator layer of a silicon on insulator wafer.

12. The radio frequency switch of claim 7, wherein:
the clamp region, the source, and the drain are all doped with a lightly doped drain implant that has a moderate implant concentration;
the source and drain are also doped with a heavy implant that has a heavy implant concentration; and
the lower dopant concentration is less than a dopant concentration of the source and drain by at least the difference between the moderate implant concentration and the heavy implant concentration.

13. The radio frequency switch of claim 7, wherein:
the first contact region extends into the source along a first portion of a width of the channel;
the second contact region extends into the drain along a second portion of the width of the channel; and the first portion of the width is smaller than the second portion of the width.

14. The radio frequency switch of claim 13, wherein:
the second portion of the width of the channel spans a finger width of the channel.

15. The radio frequency switch of claim 14, wherein:
the source is doped with a halo implant; and the drain is not doped with the halo implant.

16. A radio frequency switch comprising:
a gate that comprises a gate electrode and a gate insulator;
a channel that:
 (i) is located in a body of the radio frequency switch; and
 (ii) is insulated from the gate electrode by the gate insulator;
a first doped region located across the channel from a second doped region;
a third region that:
 (i) spans the channel;
 (ii) extends into the first and second doped regions; and (iii) has a lower dopant concentration than the first and second doped regions;
a fourth region that:
(i) spans the channel;
(ii) extends into the first and second doped regions; and
(iii) has a lower dopant concentration than the first and second doped regions;
a first silicide region that forms a first Schottky diode junction with the third region; and
a second silicide region that:
(i) is located across the channel from the first silicide region; and
(ii) forms a second Schottky diode with the third region;
wherein the third region and the fourth region are spaced apart by less than 20 microns along a width of the channel; and
wherein the third region and the fourth region are each at least 0.2 microns wide along the width of the channel.

17. The radio frequency switch of claim 16, wherein:
a lengthwise dimension vector of the third region is parallel with a lengthwise dimension vector of the fourth region.

18. The radio frequency switch of claim 17, wherein: the third and fourth regions comprise a pair of matching clamp regions.

19. The radio frequency switch of claim 18, comprising:
a plurality of transistor fingers; and
a plurality of additional clamp regions;
wherein the plurality of transistor fingers comprise a plurality of finger widths that each contribute to the width of the channel; and
wherein each additional clamp region in the plurality of clamp regions is spaced apart from at least one other additional clamp region in the plurality of clamp regions by less than 20 microns along a finger width in the plurality of finger widths.

20. The radio frequency switch of claim 19, wherein:
the pair of matching clamp regions and the plurality of additional clamp regions are each at least 0.2 microns wide along the width of the channel.

21. The radio frequency switch of claim 16, wherein:
the third region extends into the first doped region along a first portion of a width of the channel;
the third region extends into the second doped region along a second portion of the width of the channel;
the first portion of the width is larger than the second portion of the width.

22. The radio frequency switch of claim 16, comprising:
the third region comprises silicon; and
the first doped region, the second doped region, and the body are all in contact with a buried insulator layer of a silicon on insulator wafer.

23. The radio frequency switch of claim 16, wherein:
the third region, first doped region, and the second doped region, are all doped with a lightly doped drain implant that has a moderate doping concentration;
the first doped region and the second dope region are also doped with a heavy implant that has a heavy implant concentration; and
the lower dopant concentration is less than the dopant concentration of the first doped region and the second doped region by at least a difference between the heavy implant concentration and the moderate doping concentration.

* * * * *